United States Patent
Yin

(10) Patent No.: US 10,291,232 B2
(45) Date of Patent: May 14, 2019

(54) COUNTER AND COUNTING METHOD

(71) Applicant: Sanechips Technology Co., Ltd., Shenzhen, Guangdong (CN)

(72) Inventor: Junjie Yin, Shenzhen (CN)

(73) Assignee: Sanechips Technology Co., Ltd., Shenzhen, Guangdong Province (CN)

(*) Notice: Subject to any disclaimer, the term of this patent is extended or adjusted under 35 U.S.C. 154(b) by 11 days.

(21) Appl. No.: 15/519,678

(22) PCT Filed: Feb. 9, 2015

(86) PCT No.: PCT/CN2015/072594
§ 371 (c)(1),
(2) Date: Apr. 17, 2017

(87) PCT Pub. No.: WO2016/065771
PCT Pub. Date: May 6, 2016

(65) Prior Publication Data
US 2017/0264300 A1 Sep. 14, 2017

(30) Foreign Application Priority Data
Oct. 28, 2014 (CN) .......................... 2014 1 0591463

(51) Int. Cl.
*G06F 13/22* (2006.01)
*H03K 21/00* (2006.01)
(Continued)

(52) U.S. Cl.
CPC ............. *H03K 21/12* (2013.01); *G06F 13/22* (2013.01); *H03K 21/00* (2013.01); *H04L 12/08* (2013.01); *H04L 49/00* (2013.01)

(58) Field of Classification Search
CPC .......... G06F 13/00; G06F 13/22; G06M 1/00; G06M 1/044; G06M 1/104; G06M 1/105;
(Continued)

(56) References Cited

U.S. PATENT DOCUMENTS 8,345,816 B1    1/2013  Adiga et al.
2006/0265526 A1*  11/2006  Holbrook ................ H04L 49/90
                                                    710/52
(Continued)

FOREIGN PATENT DOCUMENTS

CN      1571346 A    1/2005
CN    101005413 A    7/2007
(Continued)

OTHER PUBLICATIONS

Supplementary European Search Report in European application No. 15855900.5, dated Aug. 28, 2017, 8 pgs.
(Continued)

*Primary Examiner* — Lincoln D Donovan
*Assistant Examiner* — Dave Mattison
(74) *Attorney, Agent, or Firm* — Ling Wu; Stephen Yang; Ling and Yang Intellectual Property

(57) ABSTRACT

A counter includes: a computing module (100) and N counting modules (101). Each counting module includes a plurality of counting spaces corresponding to different counting entries, and counting spaces of the same counting entry in different counting modules have the same address, wherein the counting module is arranged to provide a value for computing to the computing module in response to a counting application of a counting application source. The computing module is arranged to read values of the same counting entry in different counting modules and accumulate the read values to obtain a total count value of the counting entry, N being an integer not less than 1. Also disclosed is a counting method.

14 Claims, 8 Drawing Sheets

(51) Int. Cl.
*H03K 21/12* (2006.01)
*H04L 12/08* (2006.01)
*H04L 12/931* (2013.01)

(58) Field of Classification Search
CPC ........ H03K 21/00; H03K 21/12; H03K 23/00; H03K 23/74
USPC ........................................................ 377/114
See application file for complete search history.

(56) References Cited

U.S. PATENT DOCUMENTS

2010/0082876 A1    4/2010   Lala
2013/0145200 A1    6/2013   Adiga et al.

FOREIGN PATENT DOCUMENTS

CN    101079623 A    11/2007
CN    100546191 C    9/2009

OTHER PUBLICATIONS

"Maintaining Statistics Counters in Router Line Cards ", Jan. 2002, Devavrat Shah, Sundar Iyer, Balaji Prabhakar and Nick McKeown, IEEE Micro, IEEE Service Center, Los Alamitos, Ca, vol. 22, No. 1,1, pp. 76-81.

International Search Report in international application No. PCT/CN2015/072594, dated Jun. 24, 2015, 2 pgs.

English Translation of the Written Opinion of the International Search Authority in international application No. PCT/CN2015/072594, dated Jun. 24, 2015, 8 pgs.

* cited by examiner

Statistical counter for port data packet in switch chip

COUNTER AND COUNTING METHOD

TECHNICAL FIELD

The disclosure relates to the design of integrated circuits, and more particularly to a counter and a counting method.

BACKGROUND

In the field of design of integrated circuits, a counter is one of the commonest circuit devices. Counters constructed by a register and counters constructed by an on-chip Random Access Memory (RAM) are generally common.

Wherein, each of the counters constructed by the register may respond to a plurality of counting application sources, the refreshing rate of each counter is high, and refreshing may be conducted once within a clock period (1 count/clk). But, it is disadvantageous in that the register in chip design is high in cost, and thus not suitable for large-scale application.

As for the counters constructed by the on-chip RAM, a counter having large-scale counting entries may be constructed. Since the cost of the on-chip RAM is relatively low, a statistical counting RAM of few or even dozens of K is often used in a current chip. Currently, the counter constructed by the on-chip RAM conducts counting generally by using the following steps: selecting entries needing to be counted from an RAM, and reading a previous count value; then executing an addition or subtraction operation on the read count value and an applied counting step length to obtain a current counting result; and then writing the current counting result into a corresponding entry in the RAM.

From the abovementioned steps, it can be discovered that this group of counting entries must share the same group of counting application sources, and one of the entries in the RAM must be counted. So, in view of a circuit time sequence, it needs at least four beats (i.e., four clock periods) to complete the counting operation. Though the processing rate may be increased by utilizing a pipelining technology, it is necessary to take read-write performance limitation of the RAM device into consideration.

In conclusion, there is a lack of an economical and rapid counter capable of responding to a counting application for a plurality of counting entries currently.

SUMMARY

To solve the existing technical problems, the embodiments of the disclosure are intended to provide a counter and a counting method, suitable for an application occasion having more counting entries and a high counting application speed.

The technical solutions of the embodiments of the disclosure are implemented as follows.

The embodiments of the disclosure provide a counter. The counter may include: a computing module and N counting modules. Each counting module may include a plurality of counting spaces corresponding to different counting entries, and counting spaces of the same counting entry in different counting modules may have the same address, wherein the counting module is arranged to conduct counting in response to a counting application of a counting application source and provide a value for computing to the computing module; and the computing module is arranged to read values of the same counting entry in different counting modules and accumulatively compute the read values to obtain a total count value of the counting entry, N being an integer not less than 1.

In the abovementioned solutions, the counter may further include:

an accumulating module, including a plurality of accumulating spaces corresponding to different counting entries, and arranged to acquire and store an accumulatively processing result for more than one counting module, and allow the computing module to read the accumulatively processing result.

The counting module may be further arranged to provide an accumulatively processing count value for the accumulating module.

The computing module may be further arranged to read accumulatively processing results for the counting entries in the accumulating module, and accumulate the accumulatively processing results into a total count value of the corresponding counting entry.

In the abovementioned solutions, the counting module may include: L poll counting sub-modules, wherein each poll counting sub-module is arranged to conduct counting in response to a counting application of the counting application source within a counting period of the poll counting sub-module, and respond to a read-write operation of a non-counting application source within a non-counting period of the poll counting sub-module, L being an integer not less than 2.

In the abovementioned solutions, the counting module may include: a counting unit and a backup unit, wherein the counting unit is arranged to conduct counting in response to a counting application of a counting application source, and share a write bus with the backup unit; and the backup unit is arranged to keep data synchronization with the counting unit, and allow the computing module or the accumulating module to read data.

In the abovementioned solutions, the poll counting sub-module may include:

a poll counting unit, arranged to respond to the counting application of the counting application source within the counting period of the poll counting sub-module, respond to the read-write operation of the non-counting application source within the non-counting period of the poll counting sub-module, and share a write bus with a poll backup unit; and the poll backup unit, arranged to keep data synchronization with the poll counting unit, and allow the computing module or the accumulating module to read data.

The embodiments of the disclosure further provide a counting method. The method may include: allocating a counting module for each counting application source, and allocating respective counting spaces for different counting entries in each counting module, counting spaces of the same counting entry in different counting modules having the same address. The method may further include:

conducting, by each counting module, counting in response to a counting application of the corresponding counting application source; and reading values of the same counting entry in different counting modules, and accumulatively computing the read values to obtain a total count value of the counting entry.

In the abovementioned solutions, the method may further include:

reading count values of more than one counting module for the same counting entry, and accumulatively processing the count values;

storing an accumulatively processing result in an accumulating space corresponding to the counting entry in the accumulating module, so as to allow the computing module to read the accumulatively processing result; and zero-clearing the counting module having been accumulatively processed, the accumulatively processing referring to: accumulatively computing a count value of a counting entry in the counting module and an accumulating value corresponding to the counting entry in the accumulating module to obtain an accumulatively processing result.

In the abovementioned solutions, the method may further include:

allocating L poll counting sub-modules for each counting module; and allowing each poll counting sub-module to conduct counting in response to a counting application of the counting application source within a counting period of the poll counting sub-module, and to respond to a read-write operation of a non-counting application source within a non-counting period of the poll counting sub-module, L being an integer not less than 2.

In the abovementioned solutions, the read-write operation of the non-counting application source may include: zero-clearing operation.

In the abovementioned solutions, the method may further include:

allocating a counting unit and a backup unit for each counting module or poll counting sub-module;

allowing the counting unit to conduct counting in response to a counting application of a counting application source, and to share a write bus with the backup unit; and allowing the backup unit to keep data synchronization with the counting unit, and allowing the computing module or the accumulating module to read data.

According to the counter and the counting method provided in the embodiments of the disclosure, each counting module corresponds to a counting application source, and conducts counting in response to a counting application of the corresponding counting application source. Meanwhile, a backup unit, a counting unit or a poll counting sub-module is introduced, so expansion of a read-write bandwidth of the counting module is implemented, thus meeting demands for large-scale and high-rate counting.

DETAILED DESCRIPTION

In order to more clearly illustrate the embodiments and technical solutions of the disclosure, the technical solutions of the disclosure will be illustrated in more detail hereinbelow with reference to the drawings and the embodiments. Obviously, the described embodiments are only a part of the embodiments of the disclosure, not all of the embodiments. On the basis of the embodiments of the disclosure, all other embodiments obtained on the premise of no creative work of those skilled in the art fall within the scope of protection of the disclosure.

At present, common on-chip RAMs include a 1wr-type RAM, a 1w1r-type RAM and a 1wr1wr-type RAM. As for the 1wr-type single-port RAM, read and write operations cannot be executed within the same clock. So, even if a pipelining technology is adopted, the maximum counting speed of an entry in a counting RAM is two beats. As for the 1w1r-type RAM, read and write operations can be executed within the same clock, and the maximum counting speed of an entry in a counting RAM is one beat due to the adoption of the pipelining technology. As for the 1wr1wr-type RAM which is equivalent to an RAM composed of two single ports, wherein the maximum counting speed of an entry in a counting RAM is two beats with each single port, and the average maximum counting speed of an entry in a counting RAM is one beat with the two combined single ports.

Figure 1:
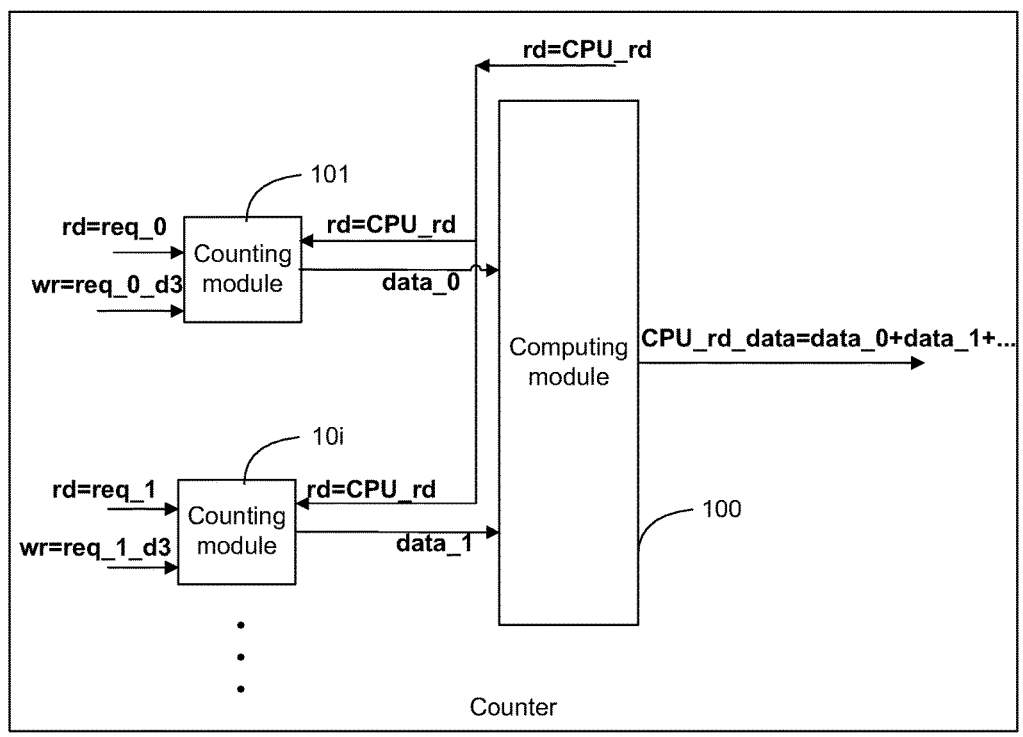
FIG. 1 is a composition structure diagram of a counter in the prior art.

When it is necessary to count a plurality of counting entries and each counting entry corresponds to a plurality of counting application sources, in order to provide the computing response performance of a counter, the embodiments of the disclosure provide a counter. As shown in FIG. 1, the counter includes: a computing module 100 and N counting modules. Each counting module includes a plurality of counting spaces corresponding to different counting entries, and counting spaces of the same counting entry in different counting modules have the same address. The N counting modules may be expressed as 101, . . . , 10n, N is an integer not less than 1, and any one of the counting modules may be marked as 10i, i=1, 2, . . . , N. Wherein, the counting module 10i is arranged to conduct counting in response to a counting application of a counting application source and provide a value for computing to the computing module; and the computing module 100 is arranged to read values of the same counting entry in different counting modules and accumulatively compute the read values to obtain a total count value of the counting entry.

Specifically, since all counting entries inside the RAM share the same group of read-write ports, only one counting entry in the RAM can be counted within each clk period. In order to enable the counter of the RAM to count more than one counting application source within one beat, a counting module may be allocated for each counting application source (i.e., the counting operation may be implemented by more than one dual-port RAM), and an independent counting space is allocated for each counting entry in each counting module, and counting spaces of the same counting entry in all counting modules have the same address. Therefore, each counting module may independently count a counting application source respectively on the basis of an address of a counting entry. For example, as shown in FIG. 1, counting units such as RAM_0 and RAM_1 are allocated for counting application source signals such as req0 and req1 respectively, wherein each counting unit may be implemented by a dual-port RAM. When the computing module is prepared for acquiring a count value of a certain entry, Cpu_rd read signals are sent to all dual-port RAMs simultaneously, the same address of all the dual-port RAMs is read, and all read count values are accumulated to serve as a final count value. For example, data0, data1, etc. are count values read in each dual-port RAM, and the final count value is CPU_rd_data=data0+data1+ . . . . Here, the computing module may be a Central Processing Unit (CPU) or other logic circuit modules. The accumulation may be addition or subtraction, which is determined according to an actual counting scenario and may be subject to subsequent embodiment 1 and embodiment 2 specifically.

Figure 2:
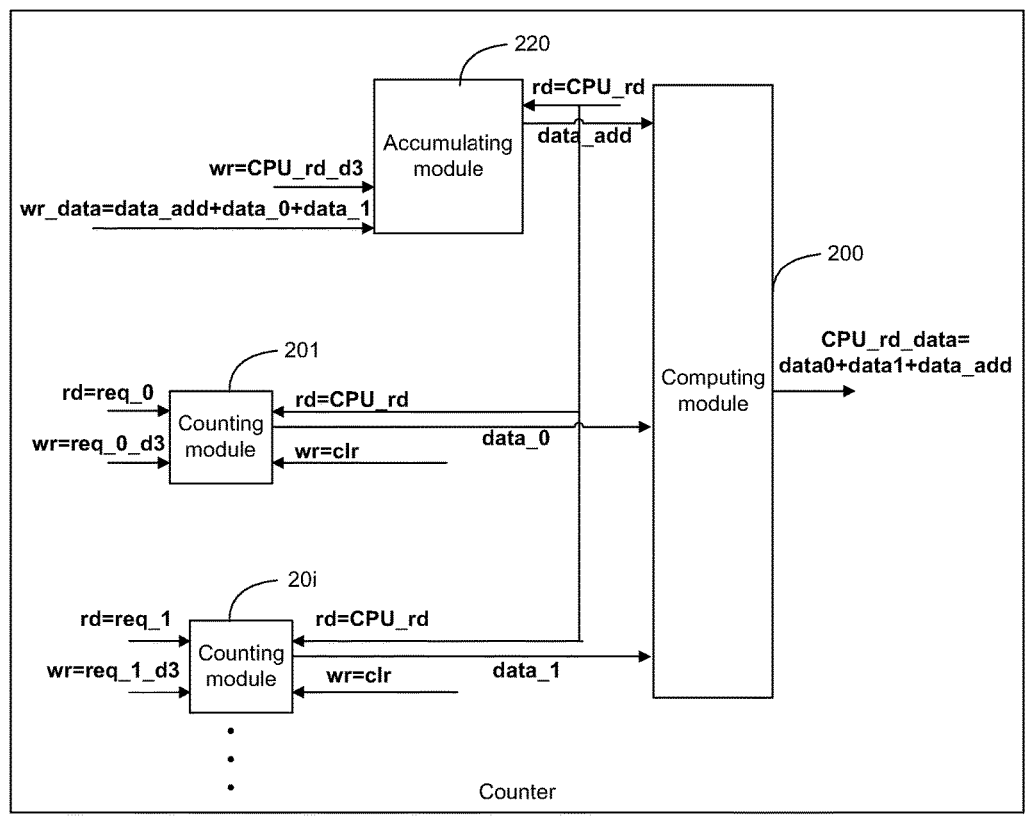
FIG. 2 is a composition structure diagram of another counter in the prior art.

Further, as shown in FIG. 2, the abovementioned counter may further include:

an accumulating module 220, including a plurality of accumulating spaces corresponding to different counting entries, and arranged to acquire and store an accumulatively processing result for more than one counting module, and allow the computing module to read the accumulatively processing result;

the counting module 20$i$ is further arranged to provide a count value for accumulatively processing to the accumulating module; and the computing module 200 is further arranged to read accumulatively processing results of the counting entries in the accumulating module 220, and accumulate the accumulatively processing results into a total count value of the corresponding counting entry.

Specifically, in order to prevent some counting module from overflowing too fast, an accumulating module may be added. The accumulating module includes a plurality of accumulating spaces corresponding to different counting entries, and is arranged to acquire and store an accumulatively processing result for more than one counting module, and allow the computing module to read the accumulatively processing result, wherein the accumulatively processing refers to: accumulatively computing a count value of a counting entry in the counting module and an accumulating value corresponding to the counting entry in the accumulating module to obtain an accumulatively processing result. For example, the accumulating module may read current count values in more than one counting module for a counting entry simultaneously, and these count values and an accumulating value in an accumulating space corresponding to the counting entry are accumulatively computed to obtain a computing result which serves as an accumulatively processing result. In order to ensure that a total count value is correct, once being accumulatively processed, the counting module will execute a zero-clearing operation. Therefore, if the computing module needs to compute a total count value of a specific counting entry, it is necessary to read a count value of the counting entry in all counting modules and it is also necessary to read an accumulatively processing result of the counting entry in the accumulating module 220, the accumulatively processing result is accumulated into the total count value of the counting entry. For example, when an accumulating value of the accumulating module 220 in FIG. 2 is marked as a count value read in each counting RAM such as data_add, data0 and data1, the total count value is marked as CPU_rd_data=data0+data1+data_add . . . finally. In practical application, the accumulating module may be implemented by a dual-port RAM, the bit width of the RAM shall be much larger than that of a dual-port RAM in the counting module, and the RAM allocates an independent accumulating space for each counting entry likewise.

However, when the rate of a certain counting application source reaches one count per one beat, the read-write bandwidth of the abovementioned counter will be fully occupied by a counting application and thus cannot be read and zero-cleared by the computing module or the accumulating module, and the bottleneck of counting rate of the counter will happen again.

But, when the sum of rate of the counting application source in FIG. 1 exceeds one count per one beat, the read-write bandwidth of a counting unit namely the dual-port RAM will be fully occupied by a read-write operation of the counting application source, so as to be unable to respond to a read signal of the computing module. Therefore, the bottleneck of counting rate exists in a situation where the sum of rate of the counting application source which can be processed by the counter as shown in FIG. 1 is one count per two beats.

In order to further expand the read-write bandwidth of the counter, a poll counting mechanism is introduced into the embodiments of the disclosure, and arranged to further adjust the structure of the abovementioned counter.

Figure 3:
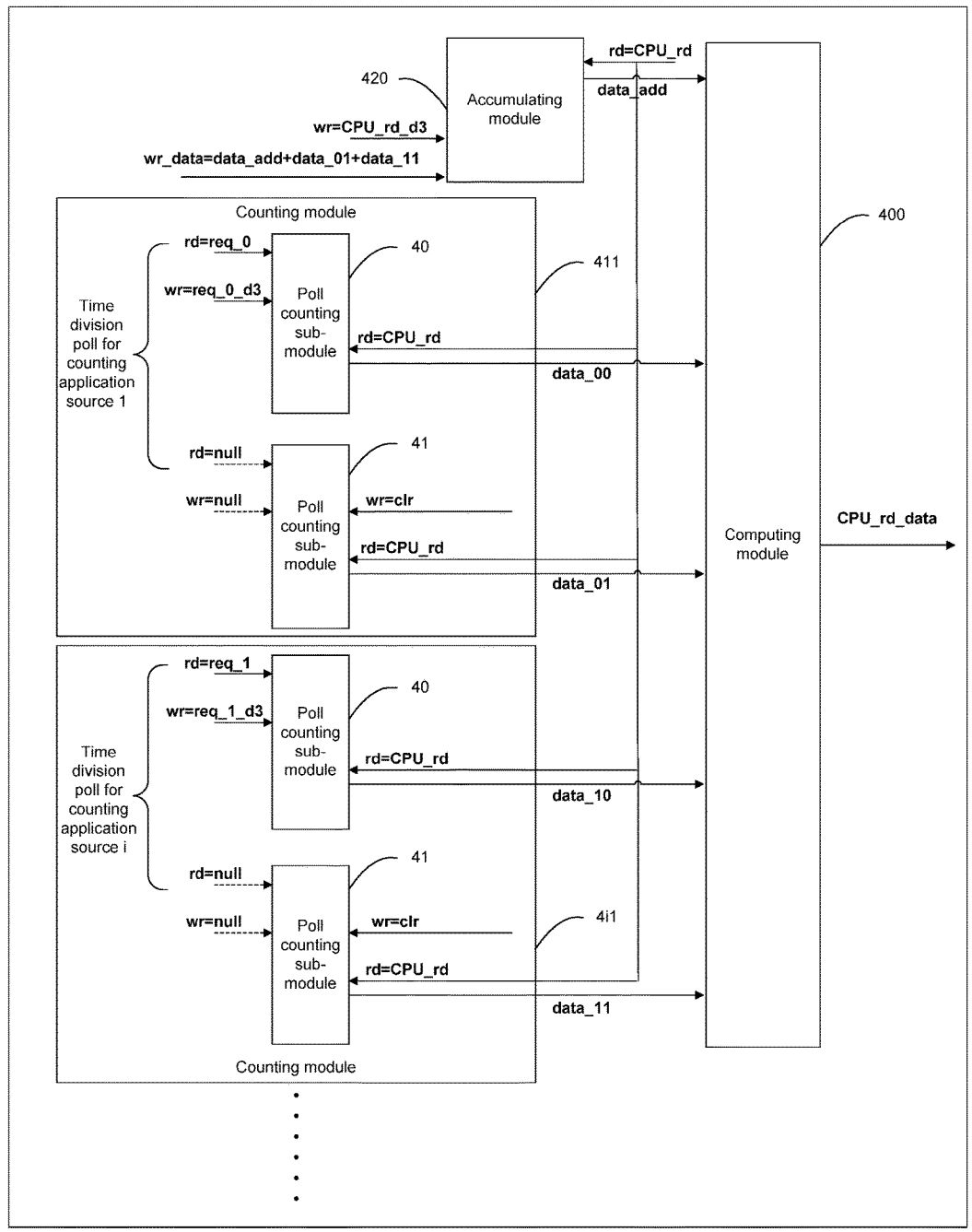
FIG. 3 is a composition structure diagram of a counter according to an embodiment of the disclosure.

Further, as shown in FIG. 3, the abovementioned counter includes: N counting modules, a computing module 400 and an accumulating module 420. The N counting modules may be expressed as 411, . . . , 4$n$1, N is an integer not less than 1, and any one of the counting modules may be marked as 4$i$1, i=1, 2, . . . , N. Wherein, the counting module 4$i$1 includes: L poll counting sub-modules, which may be marked as 40, 41, . . . , 4$k$, L is an integer not less than 2, and any one of the poll counting sub-modules may be marked as 4$k$, k=0, 1, . . . , L−1.

Each poll counting sub-module 4$k$ is arranged to conduct counting in response to a counting application of the counting application source within an own counting period, and respond to a read-write operation of a non-counting application source within an own non-counting period.

Specifically, the poll counting sub-modules 4$k$ have the same structure and function, and conduct counting in response to a counting application of the same counting application source in turns. When one poll counting sub-module 4$k$ conducts counting in response to the counting application of the counting application source, the poll counting sub-module 4$k$ is within an own counting period. When the poll counting sub-module 4$k$ is within an own non-counting period, the poll counting sub-module 4$k$ does not respond to the counting application of the counting application source. Thus, the poll counting sub-module 4$k$ may respond to a non-counting application source within the own non-counting period, that is, read-write operations of other modules. For example, in an embodiment, as shown in FIG. 3, the counting module 4$i$1 includes two poll counting sub-modules 40 and 41, when the counting module 4$i$1 needs to be zero-cleared, if the poll counting sub-module 40 is within a counting period and the counting application rate has fully occupied the write bandwidth of the poll counting sub-module 40, the poll counting sub-module 41 within a non-counting period may be zero-cleared first. When the counting period of the poll counting sub-module 40 is ended and the poll counting sub-module 40 enters the non-counting period, the poll counting sub-module 40 does not respond to the counting application any more, but the poll counting sub-module 41 continues to respond to a subsequent counting application of the same counting application source instead. At this time, the write bandwidth of the poll counting sub-module 40 is released, so that the poll counting sub-module 40 may be zero-cleared. Therefore, expansion of the read-write bandwidth of the counting module 4i1 may be implemented, thus improving the counting performance of the whole counter.

Figure 4:
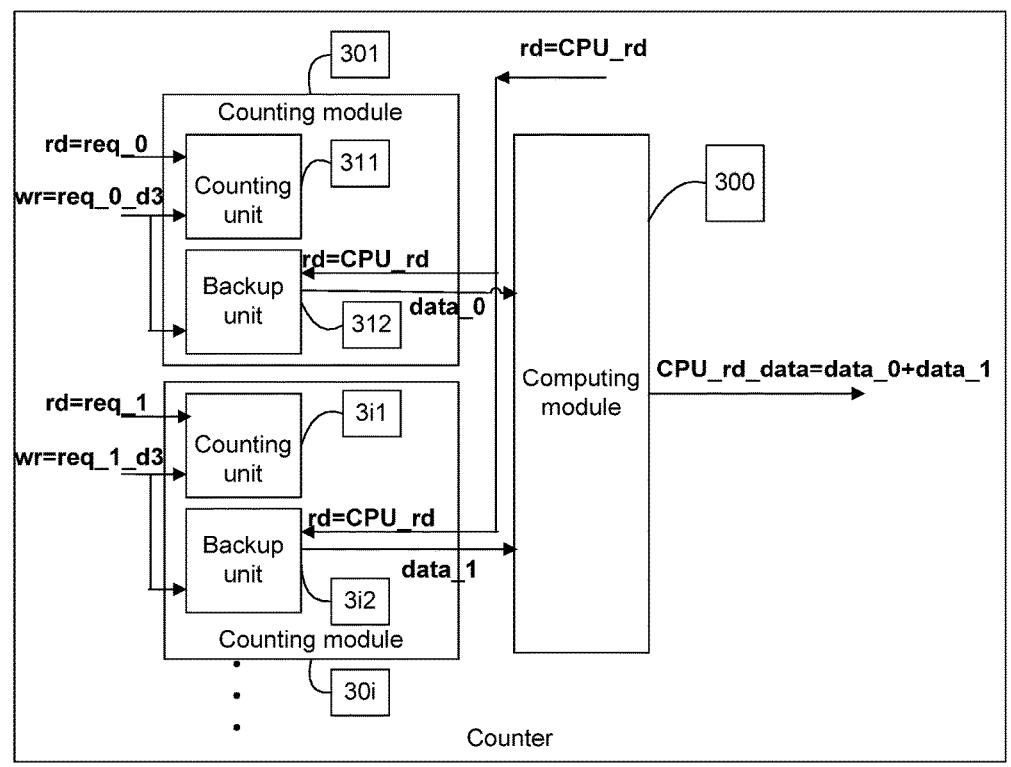
FIG. 4 is a composition structure diagram of another counter according to an embodiment of the disclosure.

In order to further ensure the stability of the counting performance of the counter, as shown in FIG. 4, the abovementioned counter includes: a computing module 300 and N counting modules. The N counting modules may be expressed as 301, . . . , 30n, N is an integer not less than 1, and any one of the counting modules may be marked as 30i, i=1, 2, . . . , N. Wherein, the counting module 30i is arranged to respond to a counting application of a counting application source and provide a value for computing to the computing module 300; and the computing module 300 is arranged to read values of the counting modules 30i and accumulatively compute the read values.

Here, the accumulation may be addition or subtraction, which is determined according to an actual counting scenario and may be subject to subsequent embodiment 1 and embodiment 2 specifically.

Further, the counting module 30i includes: a counting unit 3i1 and a backup unit 3i2, wherein the counting unit 3i1 is arranged to conduct counting in response to a counting application of a counting application source, and share a write bus with the backup unit 3i2; and the backup unit 3i2 is arranged to keep data synchronization with the counting unit 3i1, and allow the computing module 300 to read data.

Specifically, the counting unit 3i1 and the backup unit 3i2 may be implemented by a dual-port RAM respectively, the computing module 300 may be implemented by a CPU or other logic circuit modules, and the executed accumulating operation may be addition or may be subtraction.

Since the counting unit 3i1 and the backup unit 3i2 share, as shown in FIG. 3, a write bus, it may be ensured that data in addresses corresponding to the same entry in the backup unit 3i2 and the counting unit 3i1 is completely synchronized. Therefore, the computing module 300 may acquire data read according to own actual requirements by reading the data in the backup unit 3i2, and meanwhile, it is unnecessary to occupy the read bandwidth of the counting unit 3i1. Thus, the counter provided in the embodiments of the disclosure can process the rate of the counting application source and achieve a counting occasion where the rate of the counting application source reaches one count per one beat.

Figure 5:
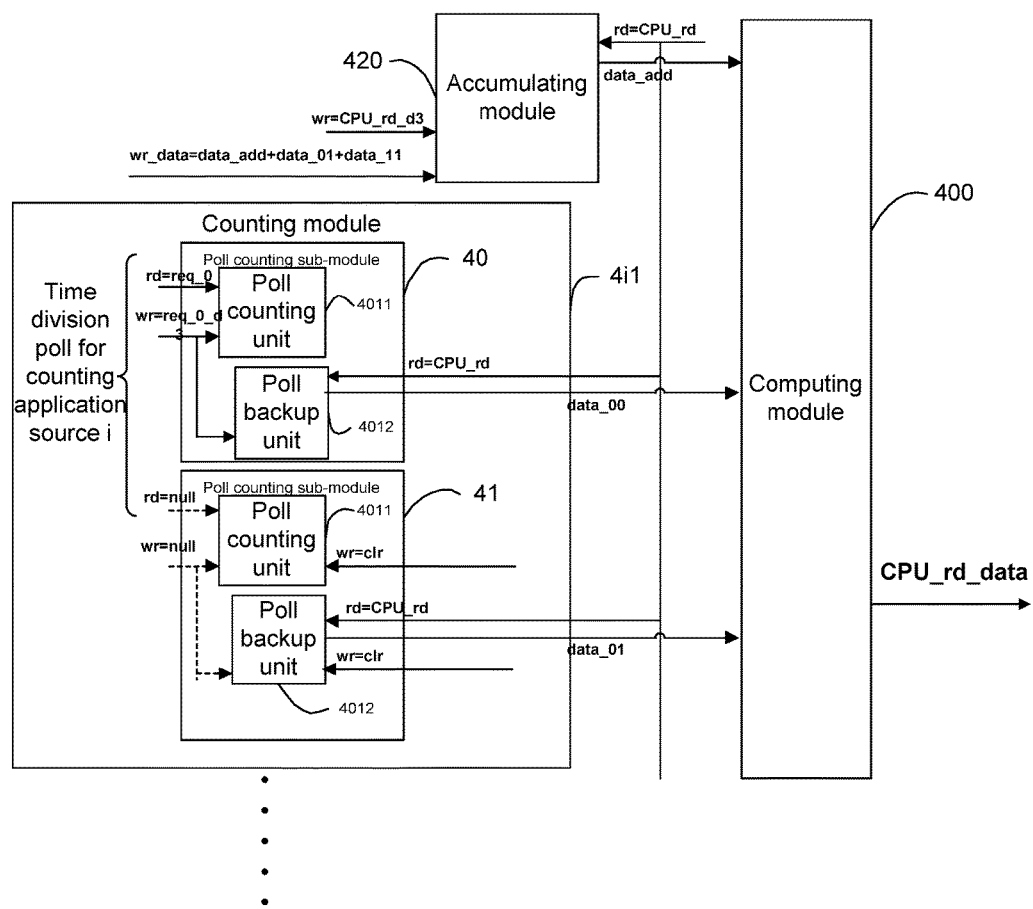
FIG. 5 is a composition structure diagram of a poll counting sub-module in a counter according to an embodiment of the disclosure.

Further, as shown in FIG. 5, in the abovementioned counter, the poll counting sub-module 4k may include:

a poll counting unit 4011, arranged to respond to the counting application of the same counting application source within the counting period, respond to the write operation of the non-counting application source within the non-counting period, and share a write bus with a poll backup unit 4012; and the poll backup unit 4012, arranged to keep data synchronization with the poll counting unit 4011, and allow the computing module 400 to read data.

Specifically, the poll counting unit 4011 and the poll backup unit 4012 may be implemented by a dual-port RAM respectively, and the poll counting sub-module is implemented by two dual-port RAMs, so the read bandwidth of the counting module 4i1 may be increased. Thus, a counting module is implemented by four dual-port RAMs, so the read and write bandwidth of the counting module 4i1 may be increased simultaneously, thereby entirely improving the counting application processing rate of the counter.

The implementation mode of the abovementioned counter will be specifically illustrated hereinbelow in conjunction with a specific application scenario.

Embodiment 1

At present, on the basis of demands of an upper-layer network management system, a large-capacity multi-port switch device often has a function of counting specific data, for example, counting the total number of specific stream id data packets discarded on all ports of a switch. At this time, since the number of stream ids is a large number based on k serving as a unit, i.e., there are many entries needing to be counted. In view of cost, a counter will be constructed on the basis of an on-chip RAM.

Since the bandwidth of each port of the switch is large, the counting application rate of each port may be high or may even exceed one count per one beat. Therefore, each port of the switch shall serve as an independent counting application source, an independent counting module responds to a counting application of each port, and the independent counting module needs to be able to process a counting application source of which the counting application rate exceeds one count per one beat.

Figure 6:
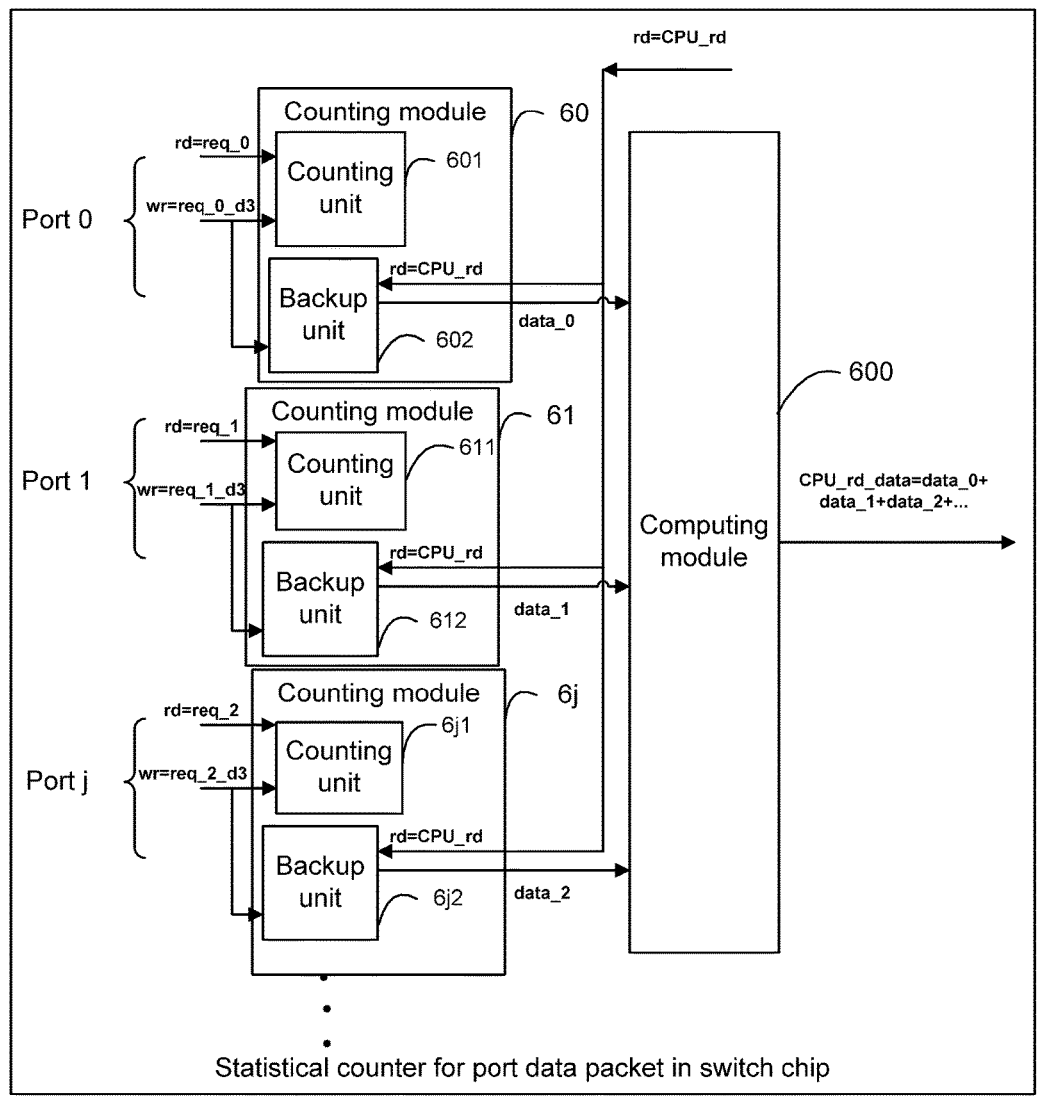
FIG. 6 is a composition structure diagram of a statistical counter for a port data packet in a switch chip according to an embodiment of the disclosure.

Therefore, the present embodiment provides a statistical counter for a port data packet in a switch chip. When the switch has M ports, M is an integer greater than 1, and the ports of the switch are numbered from 0. As shown in FIG. 6, the statistical counter for a port data packet includes: a statistical module 600 and M counting modules. The M counting modules may be expressed as 61, . . . , 6m, M is an integer not less than 1, and any one of the counting modules may be marked as 6j, j=1, 2, . . . , M−1. Wherein, the counting module 6j is arranged to respond to a counting application of a port of the switch, and count data packets transmitted via the port based on stream ids; and the statistical module 600 is arranged to compute the sum of count values of all M counting modules based on the stream ids, wherein the counting module 6j includes: a counting unit 6j1 and a backup unit 6j2, wherein the counting unit 6j1 is arranged to respond to a counting application of a port of the switch and share a write bus with the backup unit 6j2; and the backup unit 6j2 is arranged to keep data synchronization with the counting unit 6j1, and allow the computing module 600 to read data.

Specifically, the counting unit 6j1 may be implemented by a dual-port RAM, any backup unit 6j2 may be implemented by a dual-port RAM, that is, any counting module 61j is implemented by two dual-port RAMs. Thus, when the sum of counting application rate of the port j exceeds one count per one beat, the statistical module 600 acquires a needed count value by reading the backup unit 6j2 to complete summation computation.

Here, the statistical module 600 may be implemented by a CPU, a Micro Control Unit (MCU), a Digital Signal Processor (DSP) or a Field Programmable Gate Array (FPGA) in the switch chip.

The embodiment of the disclosure also provides a switch. The switch includes the statistical counter for a data packet, each port in the switch being connected with a counting module in the statistical counter for a port data packet.

Embodiment 2

A Gigabit-Capable Passive Optical Network (GPON) chip has a Weighted Random Early Discard (WRED) algorithm module to implement a random discarding operation on a data packet. This algorithm decides whether to discard a data packet or not by setting a buffer occupation threshold and a discarding probability and based on the statistical quantity of data packets in a buffer. Due to queue-based management for a buffer space in a data chip and a large number of general queues (k serves as a unit usually), a counter constructed on the basis of an RAM is needed to make statistics on an occupation situation of data packets in each queue in the buffer in a WRED module. The counter has two counting application sources; one of the counting application sources represents that a data packet applies for entering the buffer space, and a data packet entering signal is represented by a req signal. The other counting application source represents that a data packet exits from the buffer space, that is, the buffer space is recovered, and a data packet exiting signal is represented by a rcy signal. Wherein, if the req signal lasts for one beat, 1 is added to a corresponding queue buffer space; and if the rcy signal lasts for one beat, 1 is subtracted from a corresponding queue buffer space.

In the existing WRED circuit design, since there are two counting application sources, a counter is designed by adopting a 1wr1wr-type dual-port RAM usually, one 1wr port is allocated for the req signal to conduct counting, and the other 1wr port is allocated for the rcy signal to conduct counting. But, the 1wr1wr-type dual-port RAM is composed of two 1wr single ports, which determines that the maximum reaching rate of req and rcy signals supported thereby is one count per two beats and the counting performance of one-count-per-one-beat cannot be achieved. It restricts the throughput of the whole GPON chip in practical application.

Figure 7:
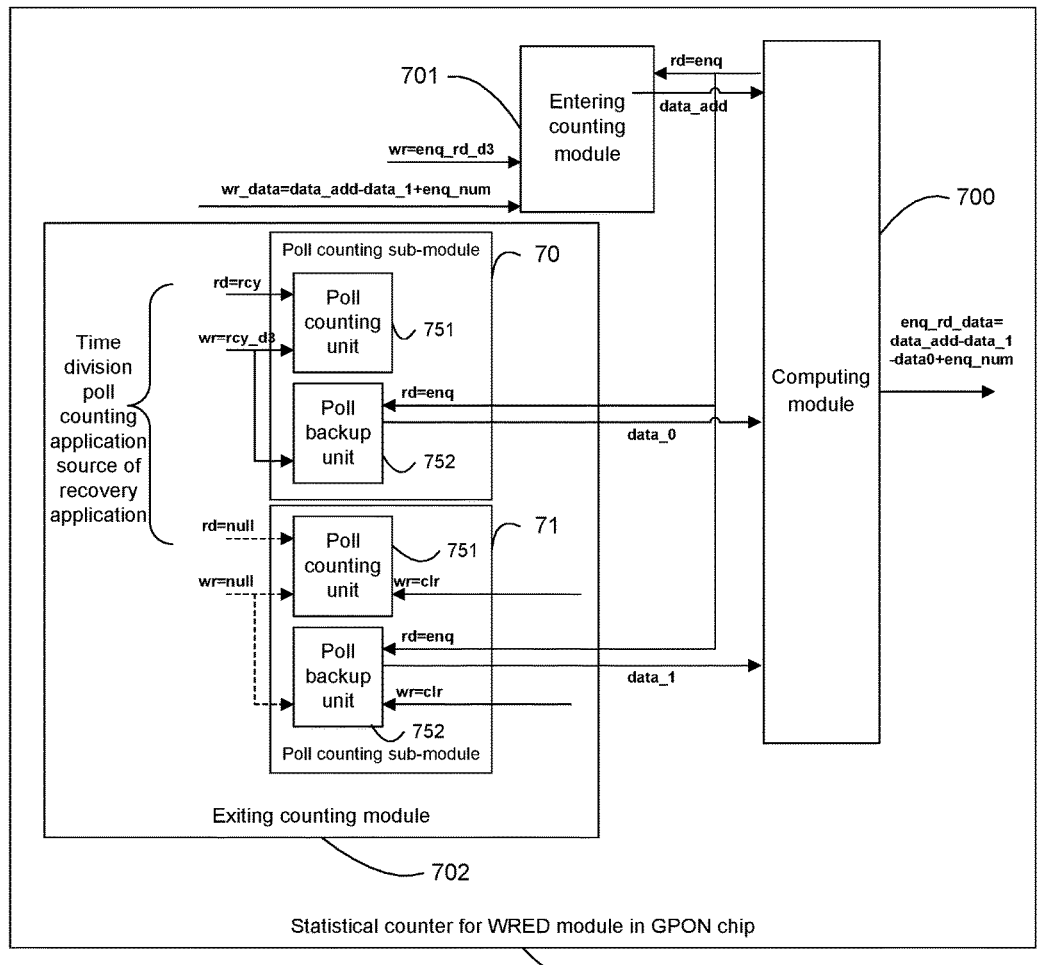
FIG. 7 is a composition structure diagram of a statistical counter for a Weighted Random Early Discard (WRED) module in a Gigabit-Capable Passive Optical Network (GPON) chip according to an embodiment of the disclosure.

To this end, embodiment 2 provides a statistical counter 77 for a WRED module in a GPON chip. As shown in FIG. 7, the statistical counter includes: an entering counting module 701, an exiting counting module 702 and a computing module 700, wherein the entering counting module 701 is arranged to count data packets entering a buffer space in response to a counting application of a data packet entering signal (req signal), and accumulate values of the exiting counting module into a count value of the entering counting module when the exiting counting module is zero-cleared, here, 'accumulation' refers to subtraction actually;

the exiting counting module 702 is arranged to count data packets exiting from the buffer space in response to a counting application of a data packet exiting signal (rcy signal); and the computing module 700 is arranged to compute actual data packets in the buffer space, wherein the counting module 702 specifically includes: two poll counting sub-modules, marked as 70 and 71 respectively, wherein the poll counting sub-module 70/71 is arranged to respond to the counting application of the data packet exiting signal (rcy signal) within a counting period, and respond to a read-write operation of a zero-clearing signal within a non-counting period.

Further, the poll counting sub-module 70/71 includes:

a poll counting unit 751, arranged to respond to the counting application of the data packet exiting signal (rcy signal) within the counting period, respond to the read-write operation of the zero-clearing signal within the non-counting period, and share a write bus with a poll backup unit 752; and the poll backup unit 752 is arranged to keep data synchronization with the poll counting unit 751, and allow the computing module 700 to read data.

Specifically, the value of the entering counting module 701 is marked as data_add; the value of the poll counting sub-module 70 is marked as data0; the value of the poll counting sub-module 71 is marked as data1; and the value of the computing module 700 is marked as enq_rd_data. So, enq_rd_data=data_add-data_1-data0+enq_num, where enq_num is a current count value of a counting application source req, and meanwhile, req is a signal for triggering a read operation by internal dut.

In order to simplify the design logic, two RAMs are not used to conduct poll counting in response to req, but values needed to add are directly added during each req application, which may realize accurate counting likewise. The poll counting sub-module 70/71 needs to conduct read zero-clearing in time, thereby avoiding counting errors caused by rcy statistical overflow. For example, before the poll counting sub-module 71 is needed to execute the zero-clearing operation, the value of the poll counting sub-module 71 is accumulated into the accumulating module 701 in advance, that is, wr_data=data_add-data_1+enq_num, here, the accumulation refers to subtraction.

In practical application, the entering counting module 701 may be implemented by a dual-port RAM having a large bit width, and the exiting counting module 702 is implemented by four dual-port RAMs having the least possible bit width so as to save the area of the RAM. The computing module 700 may be implemented by a CPU, an MCU, a DSP or an FPGA in the GPON chip.

The existing counting module 702 in the statistical counter 77 adopts four RAMs, so the WRED module may achieve the counting performance of one-count-per-one-beat.

The embodiment of the disclosure also provides a GPON chip. A WRED module in the chip includes the statistical counter in embodiment 2.

Embodiment 3

A queue buffer management module in a routing chip needs to buffer data coming from a plurality of ports (more than one port), each port including queue ids of all queues. Due to a large number of general queues (k serves as a unit usually), all of these queues will share the same buffer space, so in the queue buffer management module, a counter constructed on the basis of an RAM is needed to be allocated for each port to make statistics on an occupation situation of data packets in the queues.

Each counter has two counting application sources; one of the counting sources represents that a data packet applies for entering a buffer space, and is represented by a req signal. The other counting source represents that a data packet exits from the buffer space, that is, the buffer space is recovered, and the counting source is represented by a rcy signal. Wherein, if the req signal lasts for one beat, 1 is added to a corresponding queue buffer space; and if the rcy signal lasts for one beat, 1 is subtracted from a corresponding queue buffer space.

In the queue buffer management circuit design, there are two counting application sources for each port, a counter is designed by adopting a 1wr1wr-type dual-port RAM usually, one 1wr port is allocated for the req signal to conduct counting, and the other 1wr port is allocated for the rcy signal to conduct counting. But, the 1wr1wr-type dual-port RAM is composed of two 1wr single ports, which determines that the maximum reaching rate of req and rcy signals supported thereby is one count per two beats and the counting performance of one-count-per-one-beat cannot be achieved. It restricts the throughput of the whole routing chip in the practical circuit design.

A specific implementation mode for solving the above problem is provided hereinbelow in conjunction with FIG. 8, thus enabling the throughput of the routing chip to achieve the counting performance of one-count-per-one-beat.

Figure 8:
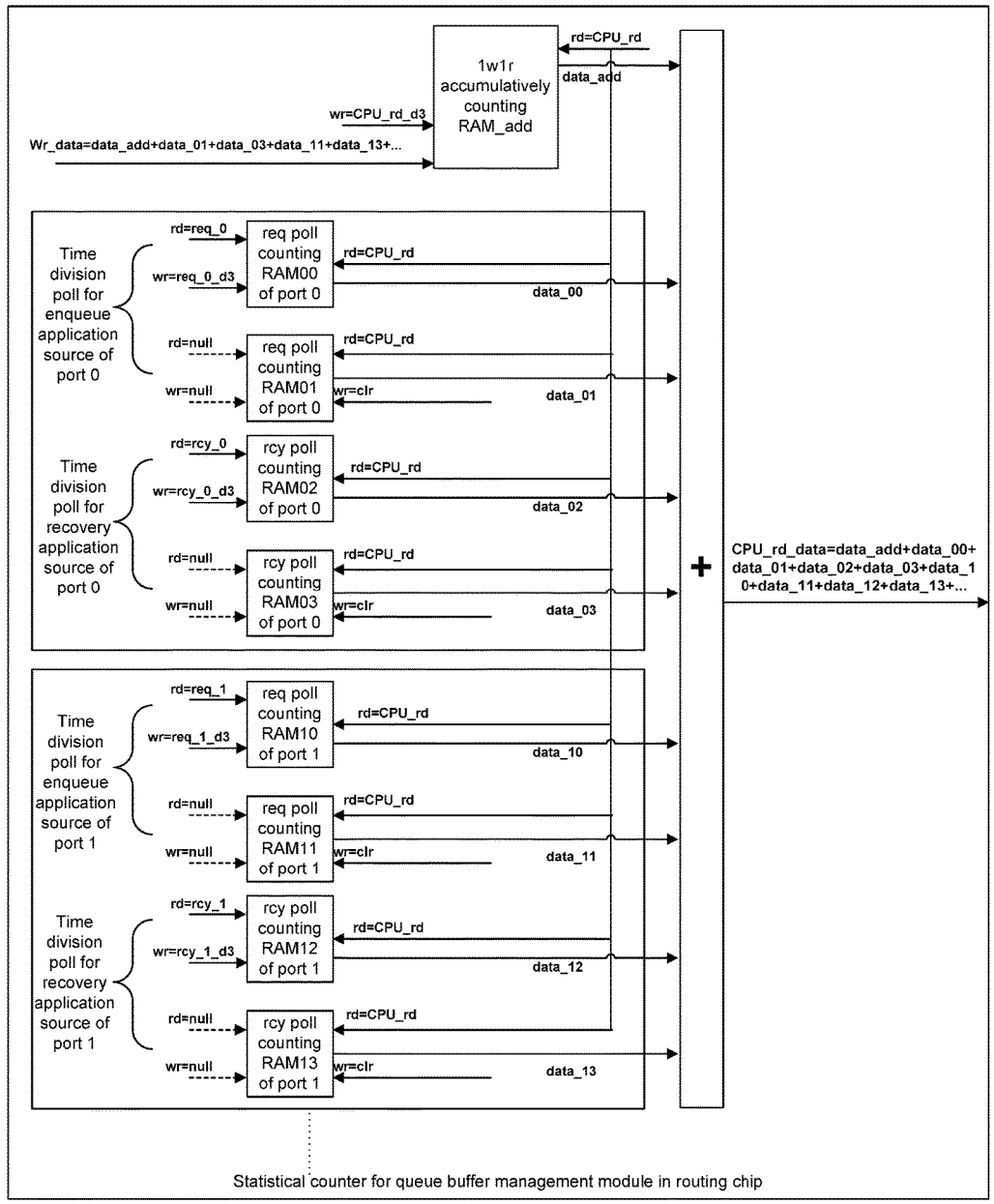
FIG. 8 is a composition structure diagram of a statistical counter for a queue buffer management module in a routing chip according to an embodiment of the disclosure.

A 1w1r-type dual-port RAM serves as an accumulatively counting RAM for all queue ids, a queue buffer management module triggers a read operation for an entire counter system by using a read operation signal of a chip internal logic DUT or CPU, and the read signal corresponds to a Cpu_id signal in FIG. 8.

A group of poll counting dual-port RAMs is allocated for an enqueue application source req and a recovery application source rcy of each port (for example, in the figure, poll counting RAMs allocated for req of port 0 are RAM00 and RAM01, poll counting RAMs allocated for rcy of port 0 are RAM02 and RAM03, and poll counting RAMs are allocated for port 1 and more other ports by parity of reasoning).

In order to ensure functional completeness, when the counting rate of a group of poll counting dual-port RAMs allocated for the enqueue application source req and the recovery application source rcy of each port reaches one count per one beat, each dual-port RAM needs a backup RAM, so it can be ensured that the chip internal logic DUT or CPU can have a read bandwidth.

As for two poll counting RAMs allocated for a req signal, namely RAM_00 and RAM_01 or RAM_02 and RAM_03, when a counting application is operated on RAM00, the read-write bandwidth of RAM_00 may be fully occupied, and when an internal logic circuit module reads the RAM, no redundant bandwidth is needed to execute a zero-clearing write operation, so during poll counting of RAM_00, RAM_00 does not execute the zero-clearing operation. However, due to no poll counting, RAM_01 may execute the zero-clearing operation. When poll time expires, a counting application operation will be executed on RAM_01, RAM_00 will enter a read zero-clearing state, and poll is continued in such way. The two poll counting RAMs allocated for the rcy signal execute the same operation.

When a read operation signal of the DUT inside the routing chip or a read operation signal of the CPU is initiated, all count values such as RAM_add, RAM00, RAM01, RAM02, RAM03, RAM10, RAM11, RAM12 and RAM13 will be read, and these values are accumulated to serve as a current queue buffer occupation value of a queue buffer management module, as shown in FIG. 8:

CPU_rd_data=data_add+data_00+data_01+data_02+data_03+data_10+data_11+data_12+data_13+ . . . ;

an accumulatively counting RAM_add accumulates values of the read zero-clearing counting RAM, and stores an obtained value in the RAM_add. That is, as shown in FIG. 8:

Wr_data=data_add+data_01+data_03+data_11+data_13+ . . . ;

a counting RAM of which poll counting is in a zero-clearing stage, such as RAM01, RAM03, RAM11 and RAM13 as shown in the figure, needs to conduct read zero-clearing in time, thereby avoiding rcy statistical overlow which may result in counting errors, and it is suggested that the rcy counting ram bit width is as small as possible, to save the area of the RAM.

In accordance with the above specific implementation mode, the queue buffer management module of the routing chip may achieve the counting performance of one-count-per-one-beat, so the throughput of the routing chip may be greatly improved.

The embodiment of the disclosure also provides a counting method. The method includes:

allocating a counting module for each counting application source, and allocating respective counting spaces for different counting entries in each counting module, counting spaces of the same counting entry in different counting modules having the same address;

conducting, by each counting module, counting in response to a counting application of the corresponding counting application source; and reading values of the same counting entry in different counting modules, accumulatively computing the read values, and taking an accumulating result as a total count value.

Here, 'accumulation' may be addition or may be subtraction, which is determined according to a specific application scenario.

In the abovementioned solutions, the method further includes:

reading count values of more than one counting module for the same counting entry, and accumulatively processing the count values;

storing an accumulatively processing result in an accumulating space corresponding to the counting entry in the accumulating module, so as to allow the computing module to read the accumulatively processing result; and then, zero-clearing the counting module having been accumulatively processed, the accumulatively processing referring to: accumulatively computing a count value of a counting entry in the counting module and an accumulating value corresponding to the counting entry in the accumulating module to obtain an accumulatively processing result.

Here, in order to avoid repeated counting, any counting module of which the counting value is accumulated into the accumulating module must be zero-cleared in time. Accordingly, any counting module of which the counting value is not accumulated into the accumulating module will not be zero-cleared.

In the abovementioned solutions, the method further includes:

allocating L poll counting sub-modules for each counting module; and allowing each poll counting sub-module to conduct counting in response to a counting application of the counting application source within a counting period of each poll counting sub-module, and to respond to a read-write operation of a non-counting application source within a non-counting period of each poll counting sub-module, L being an integer not less than 2.

In the abovementioned solutions, the read-write operation of the non-counting application source includes: zero-clearing operation.

In the abovementioned solutions, the method further includes:

allocating a counting unit and a backup unit for each counting module or poll counting sub-module;

allowing the counting unit to conduct counting in response to a counting application of a counting application source, and to share a write bus with the backup unit; and allowing the backup unit to keep data synchronization with the counting unit, and allowing the computing module or the accumulating module to read data.

In some embodiments provided by the disclosure, it should be understood that the disclosed equipment and method may be implemented in another manner. The equipment embodiment described above is only schematic, and for example, division of the units is only logic function division, and other division manners may be adopted during practical implementation. For example, multiple units or components may be combined or integrated into another system, or some characteristics may be neglected or not executed. In addition, coupling or direct coupling or communication connection between each displayed or discussed component may be indirect coupling or communication connection, implemented through some interfaces, of the equipment or the units, and may be electrical and mechanical or adopt other forms.

The abovementioned units described as separate parts may or may not be physically separated, and parts displayed as units may or may not be physical units, and namely may be located in the same place, or may also be distributed to multiple network units. Part or all of the units may be selected to achieve the purpose of the solutions of the embodiment according to a practical requirement.

The above is only the specific implementation mode of the disclosure and not intended to limit the scope of protection of the disclosure, and any variations or replacements apparent to those skilled in the art within the technical scope disclosed by the disclosure shall fall within the scope of protection of the disclosure. Therefore, the scope of protection of the disclosure shall be subject to the scope of protection of the claims.

INDUSTRIAL APPLICABILITY

Disclosed are a counter and a counting method. Each counting module corresponds to a counting application source, and conducts counting in response to a counting application of the corresponding counting application source. Meanwhile, a backup unit, a counting unit or a poll counting sub-module are introduced, so expansion of a read-write bandwidth of the counting module is implemented. Thus, the solutions provided in the embodiments of the disclosure may meet demands for large-scale and high-rate counting.

What is claimed is:

1. A counter, comprising: a computing module and N counting modules, wherein each counting module corresponds to a counting application source and comprises a plurality of counting spaces corresponding to different counting entries, and counting spaces of the same counting entry in different counting modules having the same address, wherein the counting module is arranged to conduct counting in response to a counting application of a counting application source corresponding to the counting module and provide a value for computing to the computing module;

the computing module is arranged to read values of the same counting entry in different counting modules and accumulatively compute the read values to obtain a total count value of the counting entry;

N is an integer greater than 1;

the counting module further comprises: L poll counting sub-modules, L being an integer not less than 2; and each poll counting sub-module is arranged to conduct counting in response to the counting application of the counting application source within a counting period of the poll counting sub-module, and respond to a read-write operation of a non-counting application source within a non-counting period of the poll counting sub-module.

2. The counter according to claim 1, further comprising: an accumulating module, comprising a plurality of accumulating spaces corresponding to different counting entries, and arranged to acquire and store an accumulatively processing result for more than one counting module, and allow the computing module to read the accumulatively processing result, wherein accordingly, the counting module is arranged to provide an accumulatively processing count value for the accumulating module; and the computing module is arranged to read accumulatively processing results for the counting entries in the accumulating module, and accumulate the accumulatively processing results into a total count value of the corresponding counting entry.

3. The counter according to claim 1, wherein the counting module comprises: a counting unit and a backup unit, wherein the counting unit is arranged to conduct counting in response to a counting application of a counting application source, and share a write bus with the backup unit; and the backup unit is arranged to keep data synchronization with the counting unit, and allow an computing module or the accumulating module to read data.

4. The counter according to claim 1, wherein the poll counting sub-module comprises:

a poll counting unit, arranged to respond to the counting application of the counting application source within the counting period of the poll counting sub-module, respond to the read-write operation of the non-counting application source within the non-counting period of the poll counting sub-module, and share a write bus with a poll backup unit; and the poll backup unit, arranged to keep data synchronization with the poll counting unit, and allow an computing module or the accumulating module to read data.

5. A counting method, comprising: allocating a counting module for each counting application source, and allocating respective counting spaces for different counting entries in each counting module, counting spaces of the same counting entry in different counting modules having the same address, the method further comprising:

conducting, by each counting module, counting in response to a counting application of a counting application source corresponding to the counting module; and reading values of the same counting entry in different counting modules, and accumulatively computing the read values to obtain a total count value of the counting entry;

wherein the method further comprises:

allocating L poll counting sub-modules for each counting module; and allowing each poll counting sub-module to conduct counting in response to the counting application of the counting application source within a counting period of the poll counting sub-module, and respond to a read-write operation of a non-counting application source within a non-counting period of the poll counting sub-module, wherein L is an integer not less than 2.

6. The counting method according to claim 5, further comprising:

reading count values of more than one counting module for the same counting entry, and accumulatively processing the count values;

storing an accumulatively processing result in an accumulating space corresponding to the counting entry in an accumulating module, so as to allow a computing module to read the accumulatively processing result; and zero-clearing the counting module having been accumulatively processed, the accumulatively processing referring to: accumulatively computing a count value of a counting entry in the counting module and an accumulating value corresponding to the counting entry in the accumulating module to obtain the accumulatively processing result.

7. The counting method according to claim 5, wherein the read-write operation of the non-counting application source comprises: zero-clearing operation.

8. The counting method according to claim 5, further comprising:
allocating a counting unit and a backup unit for each counting module or poll counting sub-module;
allowing the counting unit to conduct counting in response to a counting application of a counting application source, and to share a write bus with the backup unit; and
allowing the backup unit to keep data synchronization with the counting unit, and allowing a computing module or an accumulating module to read data.

9. The counter according to claim 2, wherein the counting module comprises: a counting unit and a backup unit, wherein
the counting unit is arranged to conduct counting in response to a counting application of a counting application source, and share a write bus with the backup unit; and
the backup unit is arranged to keep data synchronization with the counting unit, and allow the computing module or the accumulating module to read data.

10. The counting method according to claim 6, further comprising:
allocating a counting unit and a backup unit for each counting module or poll counting sub-module;
allowing the counting unit to conduct counting in response to a counting application of a counting application source, and to share a write bus with the backup unit; and
allowing the backup unit to keep data synchronization with the counting unit, and allowing the computing module or the accumulating module to read data.

11. The counting method according to claim 7, further comprising:
allocating a counting unit and a backup unit for each counting module or poll counting sub-module;
allowing the counting unit to conduct counting in response to a counting application of a counting application source, and to share a write bus with the backup unit; and
allowing the backup unit to keep data synchronization with the counting unit, and allowing a computing module or an accumulating module to read data.

12. A counter, comprising: a processor; and
a plurality of memories for storing instructions executed by the processor;
each memory corresponding to a counting application source and comprising a plurality of counting spaces corresponding to different counting entries, and counting spaces of the same counting entry in different memories having the same address, wherein the processor is arranged to:
conduct counting in response to a counting application of a counting application source corresponding to the memory and provide a value for computing; and
read values of the same counting entry in different memories and accumulatively compute the read values to obtain a total count value of the counting entry;
wherein the processor is further arranged to:
allocate a plurality of poll counting sub-modules for each counting module; and
allow each poll counting sub-module to conduct counting in response to the counting application of the counting application source within a counting period of the poll counting sub-module, and respond to a read-write operation of a non-counting application source within a non-counting period of the poll counting sub-module.

13. The counter according to claim 1, wherein the counting module comprises: a first poll counting sub-module and a second poll counting sub-module;
if the computing module needs to zero-clear the counting module, and the first poll counting sub-module is within a counting period of the first poll counting sub-module and counting application rate has fully occupied write bandwidth of the first poll counting sub-module, the computing module first zero-clears the second poll counting sub-module within a non-counting period of the second poll counting sub-module; and
if the counting period of the first poll counting sub-module is ended and the first poll counting sub-module enters a non-counting period of the first poll counting sub-module, the first poll counting sub-module does not respond to the counting application any more, but the second poll counting sub-module continues to respond to a subsequent counting application of the same counting application source instead.

14. The counter according to claim 1, the counter is a statistical counter, the statistical counter comprising a entering counting module, an exiting counting module and a computing module, wherein
the entering counting module is arranged to count data packets entering a buffer space in response to a counting application of a data packet entering signal, and accumulate values of the exiting counting module into a count value of the entering counting module when the exiting counting module is zero-cleared;
the exiting counting module is arranged to count data packets exiting from the buffer space in response to a counting application of a data packet exiting signal; and
the computing module is arranged to compute actual data packets in the buffer space,
wherein the counting module further comprises: two poll counting sub-modules, wherein each poll counting sub-module is arranged to respond to the counting application of the data packet exiting signal within a counting period of the poll counting sub-module, and respond to a read-write operation of a zero-clearing signal within a non-counting period of the poll counting sub-module.

* * * * *